US006998947B2

(12) United States Patent
Penn et al.

(10) Patent No.: US 6,998,947 B2
(45) Date of Patent: Feb. 14, 2006

(54) CRYOGEN PRESSURE VESSEL ASSEMBLY FOR SUPERCONDUCTING MAGNETS

(75) Inventors: Thomas Penn, Milwaukee, WI (US); Peter Feenan, North Witney (GB); David Reeves, Bloxham (GB)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/707,072

(22) Filed: Nov. 19, 2003

(65) Prior Publication Data

US 2004/0244386 A1 Dec. 9, 2004

(30) Foreign Application Priority Data

Nov. 21, 2002 (GB) .......................................... 0227226

(51) Int. Cl.
*H01F 6/00* (2006.01)
*G01V 3/00* (2006.01)

(52) U.S. Cl. ...................... 335/216; 324/318; 324/319; 324/320; 62/51.1

(58) Field of Classification Search ................ 335/216; 324/318–320; 62/51.1
See application file for complete search history.

(56) References Cited

U.S. PATENT DOCUMENTS 5,900,792 A 5/1999 Havens et al. .............. 335/216
6,218,923 B1 * 4/2001 Laskaris et al. ............ 335/299

FOREIGN PATENT DOCUMENTS

| | | |
|---|---|---|
| EP | 0 284 874 | 10/1988 |
| EP | 0 284 875 | 10/1988 |
| EP | 0 587 423 | 3/1994 |
| EP | 0 782 006 | 7/1997 |

* cited by examiner

*Primary Examiner*—Ramon M. Barrera
(74) *Attorney, Agent, or Firm*—Cantor Colburn LLP

(57) ABSTRACT

A cryogen pressure vessel assembly for a superconducting magnet comprises an inner former, an outer former, and an outer shell. The inner former has a plurality of superconducting magnet coils wound thereon, and the outer former has a plurality of bucking coils wound thereon. The inner former, the outer former, and the outer shell form a fluid boundary for a cryogen. In one aspect, a pressure face is formed on at least one of the coil formers, and a radial slot for receiving wires entering and exiting a coil is disposed in the pressure face. A plurality of wire clamps are positioned in the radial slot, with each wire clamp in the plurality of wire clamps including: a front face extending coplanar with the pressure face, a rear face opposite the front face, the rear face contacting a back surface of the radial slot, and a recess formed in the rear face, the recess forming a channel for passage of the wires.

30 Claims, 5 Drawing Sheets

100
3
112
120
116
122
106
116
104
114
102
112
108
120
3

100
120
122
116
112
58
150
152
106
44
114
108
102
104
154
156
℄

CRYOGEN PRESSURE VESSEL ASSEMBLY FOR SUPERCONDUCTING MAGNETS

CROSS REFERENCE TO RELATED APPLICATIONS

This application claims the benefit of a priority under 35 U.S.C. 119 to Great Britain Patent Application No. 0227226.8 filed Nov. 21, 2002, the entire contents of which are hereby incorporated by reference.

BACKGROUND OF INVENTION

This invention relates to superconducting magnets. More particularly, the invention relates to cryogen pressure vessel assemblies for superconducting magnets.

As is well known, a coiled magnet, if wound with wire possessing certain characteristics, can be made superconducting by placing it in an extremely cold environment, such as by enclosing it in a cryostat or pressure vessel containing liquid helium or other cryogen. The extreme cold reduces the resistance in the magnet coils to negligible levels, such that when a power source is initially connected to the coil to introduce a current flow through the coils, the current will continue to flow through the coils due to the negligible resistance even after power is removed, thereby maintaining a magnetic field. Superconducting magnets find wide application, for example, in the field of magnetic resonance imaging (hereinafter "MRI").

A typical superconducting magnet assembly for use in MRI consists of two sets of superconducting coils disposed in a cryogen vessel. An inner set of coils, usually called the main magnet coils, produce a uniform magnetic field of large magnitude in an imaging volume. The conventional cryogen pressure vessel is a circular, cylindrical drum in which a liquid cryogen, such as helium, is maintained under pressure. The main coils are wound separately around coil formers, also known as spools or bobbins, placed in grooves machined in the drum and spaced axially along the inside of the drum. Another set of outer magnet coils, known as bucking coils, are spaced from and surround the main coils, and are supported by a structure secured to the drum. The bucking coils carry currents in the direction opposite to the direction of currents being carried by the main coils so as to cancel the stray magnetic field outside the magnet.

An example of an MRI system including a superconducting magnet assembly is described in European Patent No. EP 0 587 423. As shown in FIG. 1, the magnet assembly includes a superconducting main magnet field coil assembly 10 which generates a substantially uniform magnetic field longitudinally through an examination region 12. A gradient magnetic field coil assembly 14 selectively creates gradient magnetic fields across the examination region 12. A gradient magnetic field control means 16 controls a current pulse generator 18 to apply current pulses with selected characteristics to the gradient field coils to cause the desired magnetic field pulse to be generated.

A resonance excitation and manipulation means includes a radio frequency transmitter 20 for generating radio frequency pulses of the appropriate frequency and spectrum for inducing resonance of selected dipoles in the examination region 12. The radio frequency transmitter is connected with a radio frequency antenna 22 disposed surrounding the examination region and inside the gradient magnetic field coil assembly 14. The RF coil transmits radio frequency pulses into the region of interest and receives radio frequency resonance signals emanating therefrom. Alternatively, a separate receiving coil may be provided. The received magnetic resonance signals are conveyed to a digital radio frequency receiver 24 for demodulation. The demodulated, digital radio frequency signals are reconstructed into a magnetic resonance image representation by an array processor or other image reconstruction means 26. The reconstructed image representation is stored in an image memory 28. The image representation may be displayed on a video monitor 30, subject to further processing, stored on tape or disk, or the like.

The superconducting magnet assembly 10 includes an outer vacuum vessel 40 which defines an inner, cylindrical room temperature bore 42 within which the gradient field coil assembly 14 is received. A series of superconducting, annular magnetic coils 44 are mounted on a coil former 46 and disposed within an annular cryogen pressure vessel 48. A port 50 permits the cryogen pressure vessel 48 to be maintained filled with liquid helium or the like as it evaporates to hold the temperature within the pressure vessel at about 4.2° K. Preferably, a helium recovery and recondensing system (not shown) is interconnected with the port 50. Also disposed within the cryogen pressure vessel 48 is a bucking coil assembly 56, which is mounted around the exterior of the superconducting magnet coils 44 and connected electrically in series therewith. The bucking coil assembly 56 generates a magnetic field which opposes the fields generated by the main magnets 44 in the exterior of the cryostat, while producing a strong uniform magnetic field along the bore 42. The bucking coil assembly comprises magnetic coils 58 wound around a coil former 62. The cryogen pressure vessel 48 is surrounded by a first cold shield 52 which is cooled to about 200 K. or less. A second cold shield assembly 54, which is chilled to about 60°–70° K. or less, is disposed between the inner cold shield assembly and the vacuum vessel 40. In this way, a series of thermal gradations are maintained to minimize the evaporation of the cryogen.

There are many factors that challenge the designer of a superconducting magnet assembly. First, the assembly is subject to many stresses. For example, in the process of energizing the magnets, the coils and coil former are subjected to significant electromagnetic loading. In the process of cooling the coils to superconductive temperatures, uneven cooling rates and the use of a mix of materials in the coil former can cause differential expansion in the coils and coil former, which creates stresses in the coils and coil former. The relief these stresses can cause the sudden movement of the coils, which is a major cause of quenches (rapid loss of superconductivity and collapse of magnet field) in the magnets. In addition, relative movement of coils as a result of small changes in ambient temperature or pressure can also cause inhomogeneity in the magnet. Second, space is at a premium, with many modern designs aiming to make the magnet as small as possible. These and many other factors combine to make the design of a superconducting magnet assembly very challenging.

SUMMARY OF INVENTION

The above-described deficiencies are overcome or alleviated by a cryogen pressure vessel assembly for a superconducting magnet, the assembly comprising an inner former, an outer former, and an outer shell. The inner former has a plurality of superconducting magnet coils wound thereon, and includes a first pair of end walls extending therefrom. The outer former has a plurality of bucking coils wound thereon and a second pair of end walls extending therefrom. The outer former extends between the first pair of end walls, and the outer shell extends between the second pair of end walls. The inner former, the outer former, the first pair of end walls, the second pair of end walls, and the outer shell form a fluid boundary for the cryogen.

In one aspect, a pressure face is formed on at least one of the coil formers, and a radial slot for receiving wires entering and exiting the coil is disposed in the pressure face. A plurality of wire clamps are positioned in the radial slot, with each wire clamp in the plurality of wire clamps including: a front face extending coplanar with the pressure face, a rear face opposite the front face, the rear face contacting a back surface of the radial slot, and a recess formed in the rear face, the recess forming a channel for passage of the wires entering and exiting the coil. In another aspect, first and second arcuate slots are in communication with the recess. The first and second arcuate slots are sized to accept a single wire forming a portion of the coil.

The above discussed and other features and advantages of the present invention will be appreciated and understood by those skilled in the art from the following detailed description and drawings.

BRIEF DESCRIPTION OF DRAWINGS

Referring to the exemplary drawings wherein like elements are numbered alike in the several FIGS..

DETAILED DESCRIPTION

Figure 1:
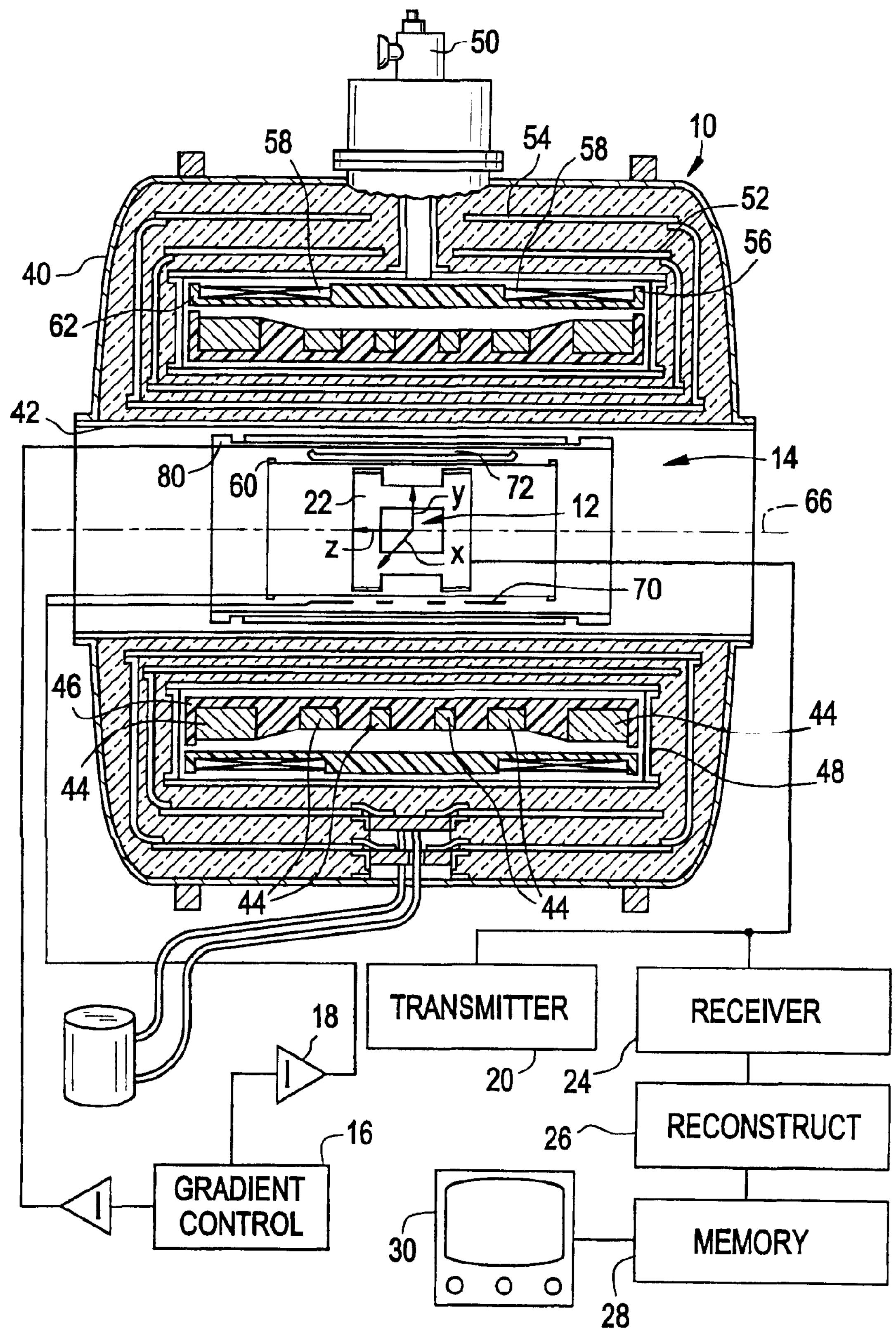
FIG. 1 is a schematic diagram of a magnetic resonance imaging system including a superconducting magnet assembly.
Figure 2:
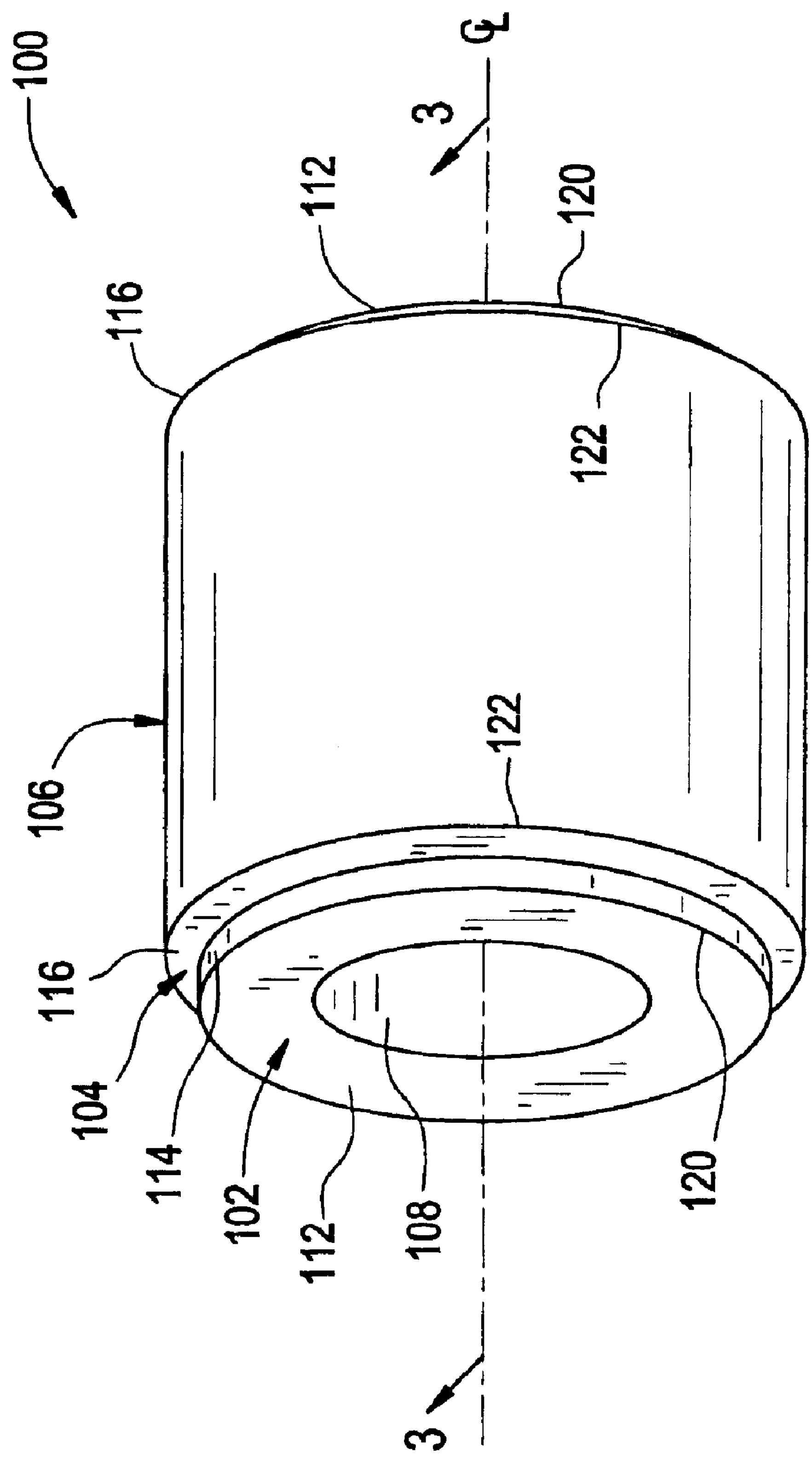
FIG. 2 is a perspective view of a cryogen pressure vessel assembly.
Figure 3:
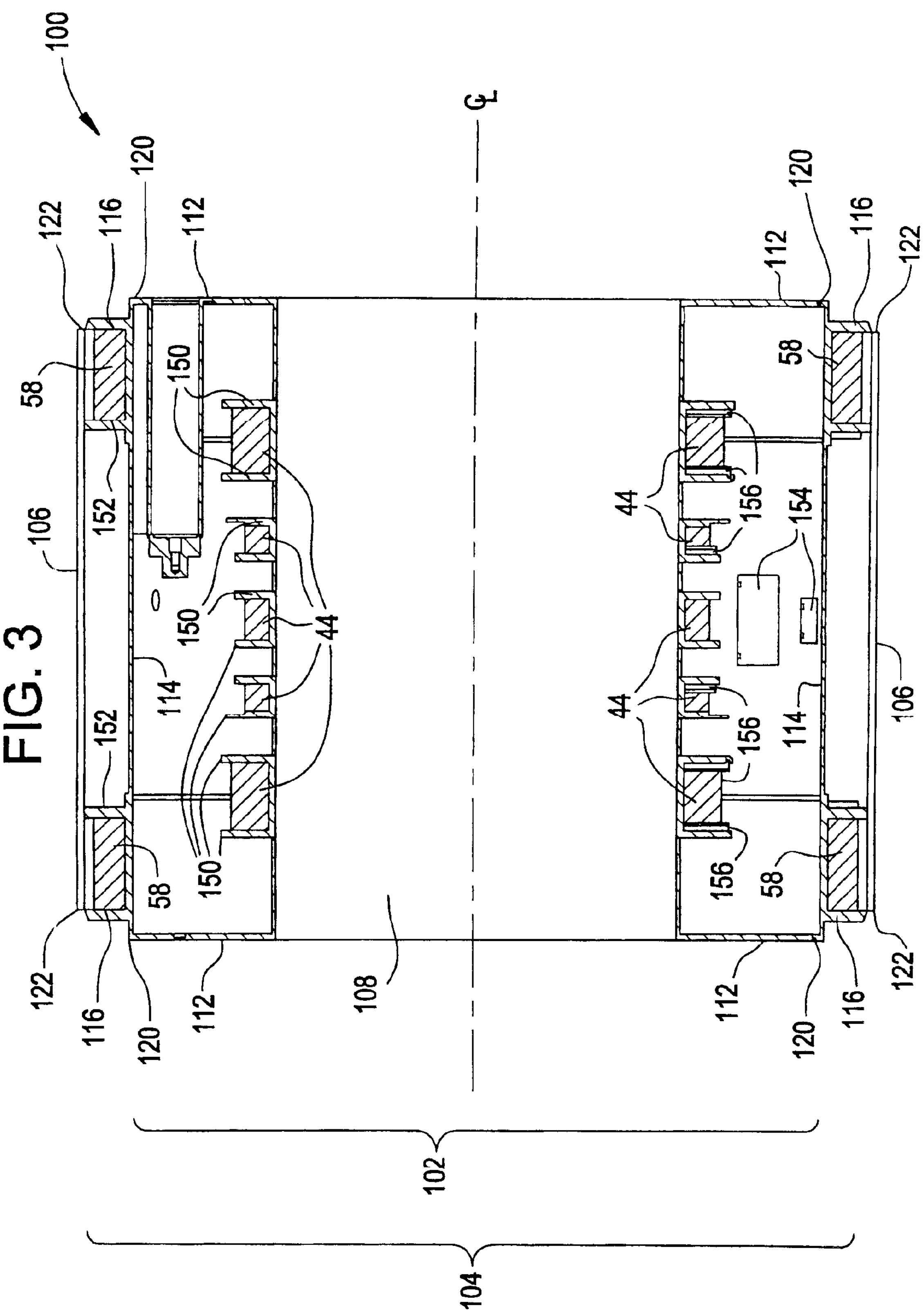
FIG. 3 is a cross-sectional view of the cryogen pressure vessel taken along 3—3 in FIG. 2.

Referring to FIGS. 2 and 3, a cryogen pressure vessel is shown generally at 100. Cryogen pressure vessel 100 may be used, for example, in place of prior art cryogen pressure vessel 48 of FIG. 1. Cryogen pressure vessel 100 is a generally cylindrical structure formed from three concentric structures: an inner former 102 nested within an outer former 104 and an outer shell 106. Inner former 102 includes a cylindrical shell 108 and end walls 112, which are positioned at the ends of cylindrical shell 108 and extend radially outward about the perimeter of the cylindrical shell 108. Outer former 104 includes a cylindrical shell 114, which extends between end walls 112. Outer former 104 also includes end walls 116, which extend radially outward about the perimeter of the cylindrical shell 114. Outer shell 106 is a cylindrical shell, which extends between end walls 116.

Formed between the outside diameters of the end walls 112 and an inside diameter of cylindrical shell 114 are seams 120, and formed between the outside diameters of the end walls 116 and an inside diameter of outer shell 106 are seams 122. The seams 120 and 122 are joined using, for example, welding, to create a sealed vessel in which liquid cryogen (e.g., liquid helium) may be contained. Cylindrical shells 108 and 116, end walls 112 and 116, and outer shell 106 form a fluid boundary for the cryogen.

As is shown in FIG. 3, inner former 102 includes a plurality of coil former walls 150 that, along with cylindrical shell 108, form pockets for supporting superconducting magnet net coils 44. Coil former walls 150 are disposed on the cylindrical shell 108 between the end walls 112, and extend radially outward about the perimeter of cylindrical shell 108. Similarly, outer former 104 includes a plurality of coil former walls 152, which extend radially outward about the perimeter of cylindrical shell 114. Bucking coils 58 are supported in pockets formed between coil former walls 152, end walls 116, and cylindrical shell 114. Various apertures 154 are disposed in cylindrical shell 114 and outer shell 106 to allow passage of wiring for coils 44 and 58 and to allow for evaporation of liquid cryogen.

As can be seen in FIG. 3, a portion of cylindrical shell 108 proximate superconducting coils 44 may have an increased thickness, as is needed to provide support to superconducting coils 44. Similarly, a portion of cylindrical shell 114 proximate bucking coils 58 may have an increased thickness, as is needed to provide support to bucking coils 58.

Inner former 102 may be machined from a single piece of material such as, for example, stainless steel. Alternatively, inner former 102 may be formed from carbon fiber, fiberglass, or the like. Similarly, outer former 104 may be machined from a single piece of material such as, for example, stainless steel. Alternatively, outer former 104 may be formed from carbon fiber, fiberglass, or the like. Preferably, inner former 102, outer former 104, and outer shell are constructed of the same material to reduce the possibility of differential expansion and, thereby reduce the possibility of sudden coil movement, which can initiate quenches.

Cryogen pressure vessel 100 is assembled by winding coils 44 and 58 directly onto inner former 102 and outer former 104, respectively. The inner former 102 is then inserted within the outer former 104, and seam 120 is welded. The inner and outer formers 102 and 104 are then inserted within the outer shell 106, and seam 122 is welded.

The present invention provides concentric cylinders 108 and 114 as integral structural members of the cryogen vessel 100, and the coils 44 and 58 are wound directly into pockets formed on these cylinders. This design makes use of an integral structure which serves as both the coil former for winding coils 44 and 58, and as the pressure vessel containing the liquid cryogen. As the cylinders 108 and 114 are all constructed of the same material, and as there are no bolted junctions, there is no possibility of sudden movements of the windings 44 and 58 to initiate quenches. Thus, the present invention provides for a simple and structurally efficient way to make a stiff cryogen vessel with no differential expansion of the coil formers and no possibility of sudden movements of the coil formers with respect to each other. In addition, the need for separate coil formers is eliminated, saving valuable radial space. The structure carries all the loads imposed by the winding of the coils, the operating stress of the coils, and the mechanical stresses due to the weight of the magnet and the suspension system.

Referring again to FIG. 3, each superconducting coil 44, 58 is mounted within the pockets formed by the coil former walls 150 and 152, respectively. As is known, each coil 44 and 58 comprises several partial coils, resulting in many wires entering and leaving the pocket in which the coils 44 and 58 are formed. For example, there can be as many as twelve wires entering and exiting each coil 44 or 58. To allow the wires to enter and exit the pocket, a radial slot 156 is disposed in one or more of the coil former walls 150 and 152.

Figure 4:
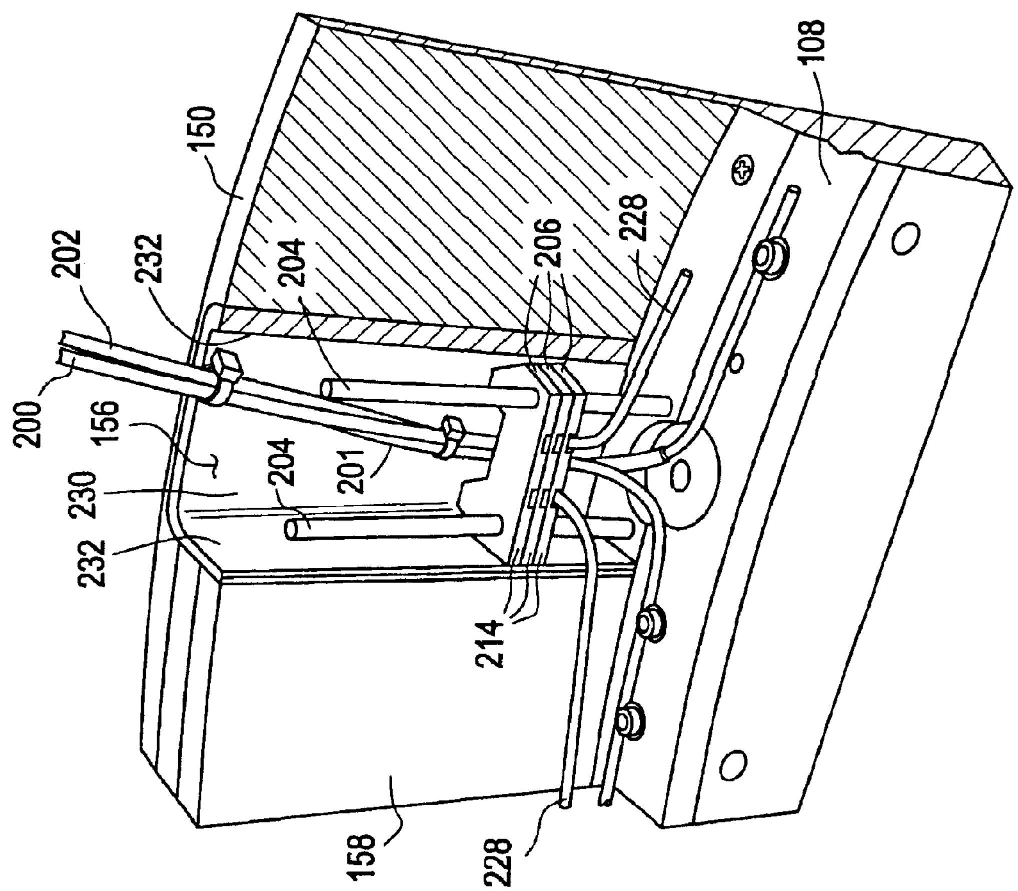
FIG. 4 depicts a plurality of wire clamps disposed within a slot formed in a magnet former.

Referring now to FIG. 4, a section of a coil former wall 150 including a radial slot 156 is shown. In the embodiment of FIG. 4, the radial slot 156 extends along the entire height of a pressure face 158 of the coil former wall 150, from cylindrical shell 108 to the outside diameter of coil former wall 150. The pressure face 158 is the face of the coil former wall 150 that faces the coil 44. A plurality of wires, 200, 201, and 202, which form a portion of coil 44 (FIG. 3) are disposed in radial slot 156. It will be recognized that while only three wires 200, 201, and 202 are shown for example, and that many additional wires may be needed to form a coil 44.

Disposed within slot 156 is a pair of alignment pins 204, which are each rigidly secured to cylindrical shell 108. Alignment pins 204 act to align and secure a plurality of wire clamps 206 within radial slot 156.

Figure 6:
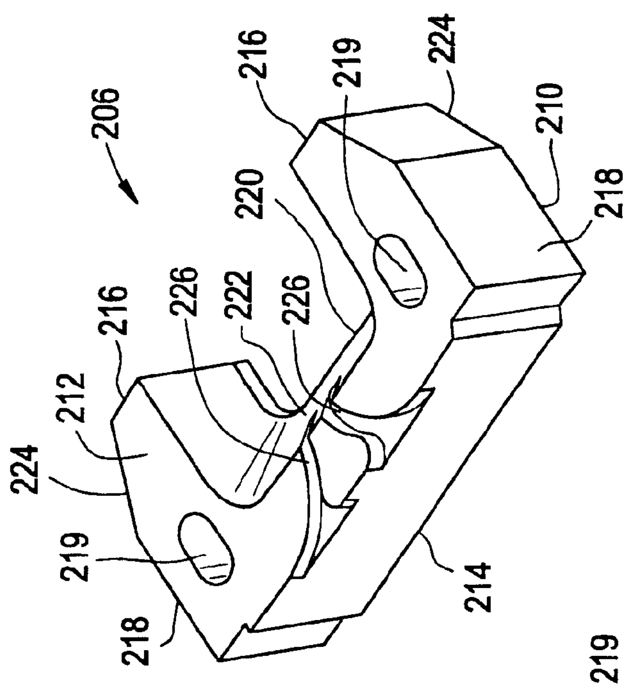
FIG. 6 is an is a bottom perspective view of the wire clamp of FIG. 4.
Figure 7:
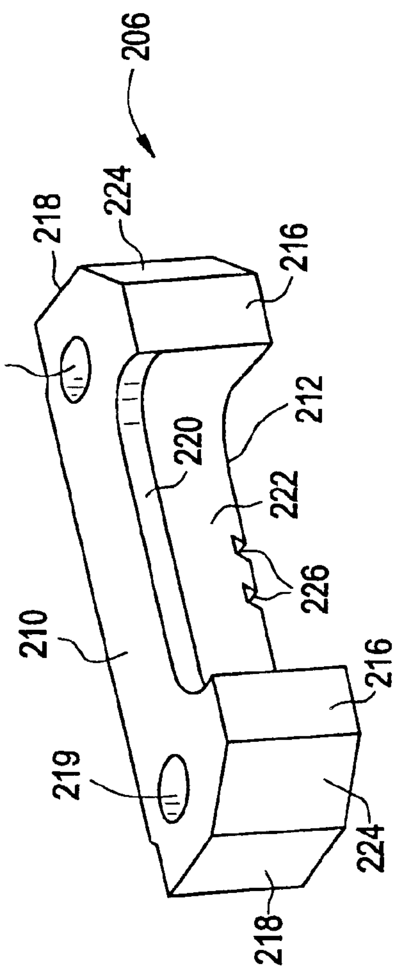
FIG. 7 is a back perspective view of the wire clamp of FIG. 4.
Figure 5:
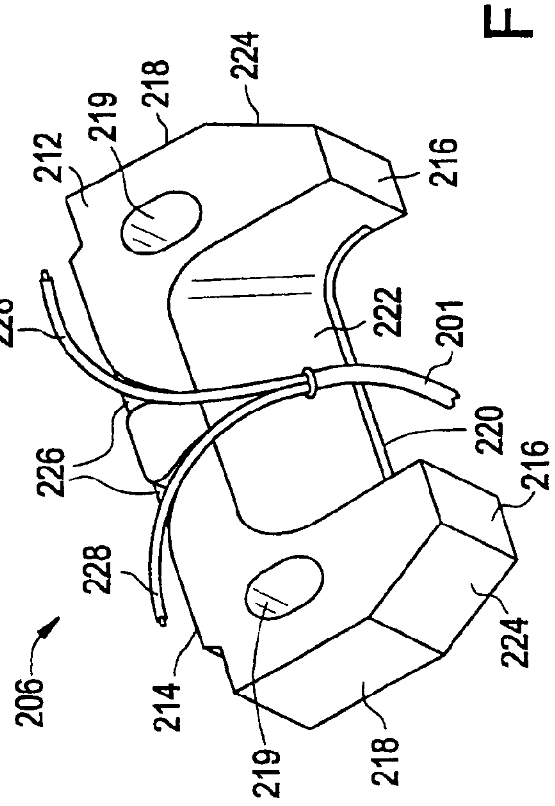
FIG. 5 is a top perspective view of a wire clamp of FIG. 4.

Referring to FIGS. 5–7, various views of a wire clamp 206 are shown. Wire clamp 206 is a structure having a top face 210, a bottom face 212, a front face 214, a back face 216, and side faces 218. Extending from top face to bottom face, and positioned proximate side faces 218, are a pair of apertures 219. Apertures 219 accept alignment pins 204 (FIG. 4). Disposed in back face 216, and extending from top face 210 to bottom face 212, is a generally u-shaped recess 220. A chamfer 222 is formed between u-shaped recess 220 and bottom face 212. Chamfers 224 are also formed between each side face 218 and end face 216.

Formed on bottom face 212 and extending from chamfer 222 to front face 214 are two arcuate slots 226. As is shown in FIG. 5, each arcuate slot 226 is sized to accept a single wire 228, with the arc of the slot being configured to support a gradual bend of the wire. The arcs in each pair of arcuate slots 226 oppose each other such that the wires 228 disposed in slots 226 bend in opposite directions. The ends of slots 226 proximate front face 214 are radiused to remove any sharp edges that may damage the wires 228. The arcuate slots 226 may be dimensioned such that, when a wire 228 is captured between two adjacent wire clamps 206, the insulation of the wire is compressed in the arcuate slots 226, thereby holding the wire 228 tight and maintaining winding tension. To ensure that each wire 228 is electrically insulated from each other, the wire clamps 206 are preferably manufactured from an electrically insulative material.

Referring to FIGS. 4 and 5, the arrangement of wire clamps 206 within slot 156 can now be described. Wire clamps 206 are positioned on alignment pins 204 in stacked relationship, with alignment pins 204 extending through apertures 219 and opposing top and bottom faces 210 and 212 of adjacent wire clamps 206 contacting each other. In this configuration, the top face 210 of an adjacent wire clamp 206 acts to retain wires 228 within the arcuate slots 226.

The wire clamps 206 and radial slot 156 are dimensioned such that: the front face 214 of each wire clamp 206 is aligned coplanar with the pressure face 158 of coil former wall 150; the back face 216 of each wire clamp 206 contacts a rear surface 230 of the radial slot 156; and the side faces 218 of each wire clamp 206 contact side surfaces 232 of the radial slot 156. When the wire clamps 206 are in position, the u-shaped recesses 220 of the wire clamps 206 form a passage for the wires (e.g., 200, 201, 202) along the rear surface 230 of the radial slot 156. The passage ensures that any pressure placed on the front face 214 of the wire clamps 206 by the coils 44 will be translated to the rear surface 230 of the radial slot 156, and will not damage the wires. This design allows a large area for routing wires in and out, while matching the stiffness of the pressure face 158 with the strength of the wire clamps 206.

The chamfer 222 formed in each wire clamp 206 allows a wire (e.g., 201) to gradually bend away from the rear surface 230 of the radial slot 156 so that it may be received in the arcuate slots 226. One of the arcuate slots 226 directs a wire 228 from the wire clamp 206 in a direction generally parallel to the front face 214 and pressure face 158. After the wire is wrapped around the cylindrical shell 108 to form a partial coil, the wire 228 is received in the other arcuate slot 226.

The wire clamps 206 serve to route wire radially in the pockets formed by coil former walls 150 and 152, introducing the wire into and out of the coil at the correct depth in the pocket. The wire clamps 206 also serve to hold the wire tight to maintain winding tension. In addition, the clamps 206 carry loads from the pressure face 158 to the back of the slot 230, thus preventing these loads from causing wire movement. By preventing wire movement, the wire clamps 206 prevent quenches in the magnets.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A cryogen pressure vessel assembly for a superconducting magnet, the cryogen pressure vessel assembly comprising:

an inner former having a plurality of superconducting magnet coils wound thereon, said inner former including a first pair of end walls extending therefrom;

an outer former having a plurality of bucking coils wound thereon, said outer former extending between said first pair of end walls and including a second pair of end walls extending therefrom;

an outer shell extending between said second pair of end walls; and wherein said inner former, said outer former, said first pair of end walls, said second pair of end walls, and said outer shell form a fluid boundary for a cryogen.

2. The cryogen pressure vessel assembly of claim 1, wherein said inner former further includes:

a first plurality of coil former walls extending radially outward about a perimeter of said first shell, said first plurality of coil former walls forming a plurality of pockets for said plurality of superconducting magnet coils.

3. The cryogen pressure vessel assembly of claim 2, further comprising:

a second plurality of coil former walls extending radially outward about a perimeter of said second shell, said second plurality of coil former walls forming a plurality of pockets for said plurality of bucking coils.

4. The cryogen pressure vessel assembly of claim 2, said cryogen pressure vessel assembly further comprising:

a pressure face formed on at least one coil former wall in said plurality of coil former walls;

a radial slot disposed in said pressure face, said radial slot for receiving wires entering and exiting a superconducting magnet coil; and a plurality of wire clamps positioned in said radial slot, each wire clamp in said plurality of wire clamps including:

a front face extending coplanar with said pressure face, a rear face opposite said front face, said rear face contacting a back surface of said radial slot, and a recess formed in said rear face, said recess forming a channel for passage of said wires entering and exiting said superconducting magnet coil.

5. The cryogen pressure vessel assembly of claim 4, wherein each wire clamp in said plurality of wire clamps further includes:

first and second arcuate slots in communication with said recess, said first and second arcuate slots being sized to accept a single wire forming a portion of said superconducting magnet coil.

6. The cryogen pressure vessel assembly of claim 5, wherein each wire clamp in said plurality of wire clamps further includes:

a chamfer extending between said recess and said first and second arcuate slots.

7. The cryogen pressure vessel assembly of claim 4, further comprising:

alignment pins extending along said radial slot from said first shell, said plurality of wire clamps being disposed on said alignment pins.

8. A cryogen pressure vessel assembly for a superconducting magnet, the cryogen pressure vessel assembly comprising:

a first cylindrical shell forming a first portion of a fluid boundary for a cryogen;

a first pair of coil former walls extending radially outward about a perimeter of said first cylindrical shell, said first pair of coil former walls said first cylindrical shell forming a pocket;

a superconducting magnet coil disposed in said pocket;

a first pair of end walls extending radially outward about said perimeter of said first cylindrical shell, said first pair of coil former walls and said superconducting magnet coil being positioned between said first pair of end walls;

a second cylindrical shell coaxial to said first cylindrical shell and extending between said first pair of end walls, said first pair of end walls and said second cylindrical shell forming a second portion of said fluid boundary for said cryogen;

a second pair of coil former walls extending radially outward about a perimeter of said second cylindrical shell, said second pair of coil former walls forming at least one pocket; and a bucking coil disposed in said at least one pocket.

9. The cryogen pressure vessel assembly of claim 8, further comprising:

a second pair of end walls extending radially outward about a perimeter of said second cylindrical shell; and an third cylindrical shell coaxial to said first cylindrical shell and extending between said second pair of end walls, said second pair of end walls and said third cylindrical shell forming a third portion of said fluid boundary for said cryogen.

10. The cryogen pressure vessel assembly of claim 8, said cryogen pressure vessel assembly further comprising:

a pressure face formed on at least one coil former wall in said first pair of coil former walls, said pressure face contacting said superconducting magnet coil;

a radial slot disposed in said pressure face, said radial slot for receiving wires entering and exiting said superconducting magnet coil, and a plurality of wire clamps positioned in said radial slot, each wire clamp in said plurality of wire clamps including:

a front face extending coplaner with said pressure face, a rear face opposite said front face, said rear contacting a back surface of said radial slot, and a recess formed in said rear face, said recess forming a channel for passage of said wires entering and exiting said superconducting magnet coil.

11. The cryogen pressure vessel assembly of claim 10, wherein each wire clamp in said plurality of wire clamps further includes:

first and second arcuate slots in communication with said recess, said first and second arcuate slots being sized to accept a single wire forming a portion of said superconducting magnet coil.

12. The cryogen pressure vessel assembly of claim 11, wherein each wire clamp in said plurality of wire clamps further includes:

a chamfer extending between said recess and said first and second arcuate slots.

13. The cryogen pressure vessel assembly of claim 10, further comprising, alignment pins extending along said radial slot from said first cylindrical shell, said plurality of wire clamps being disposed on said alignment pins.

14. A cryogen pressure vessel assembly for a superconducting magnet, the cryogen pressure vessel comprising:

a coil former;

a coil disposed on said coil former;

a pressure face formed on said coil former, said pressure face contacting said coil;

a radial slot disposed in said pressure face, said radial slot for receiving wires entering and exiting said coil; and a plurality of wire clamps positioned in said radial slot, each wire clamp in said plurality of wire clamps including:

a front face extending coplanar with said pressure face, a rear face opposite said front face, said rear face contacting a back surface of said radial slot, and a recess formed in said rear face, said recess forming a channel for passage of said wires entering and exiting said coil.

15. The cryogen pressure vessel assembly of claim 14, wherein each wire clamp in said plurality of wire clamps further includes:

first and second arcuate slots in communication with said recess, said first and second arcuate slots being sized to accept a single wire forming a portion of said coil.

16. The cryogen pressure vessel assembly of claim 15, wherein each wire clamp in said plurality of wire clamps further includes:

a chamfer extending between said recess and said first and second arucate slots.

17. The cryogen pressure vessel assembly of claim 14, further comprising:

alignment pins extending along said radial slot, said plurality of wire clamps being disposed on said alignment pins.

18. A method of assembling a cryogen pressure vessel assembly, the method comprising:

winding a plurality of superconducting magnet coils around a first cylindrical shell, said first cylindrical shell including a first pair of end walls extending radially outward about a perimeter of said first cylindrical shell;

winding a plurality of bucking coils around a second cylindrical shell;

inserting said first cylindrical shell within said second cylindrical shell;

joining a first seam formed between said second cylindrical shell and outside diameters of said first pair of end walls.

19. The method of claim 18, wherein said second cylindrical shell includes a second pair of end walls extending radially outward about a perimeter of said second cylindrical shell, said method further comprising:

inserting said second cylindrical shell within a third cylindrical shell; and joining a second seam formed between said third cylindrical shell and outside diameters of said second pair of end walls.

20. The method of claim 19, wherein said joining said first seam and said joining said second seam each include welding said seams.

21. A superconducting magnet assembly comprising:

an outer vacuum vessel defining an inner bore; and a cryogen pressure vessel disposed within said outer vacuum vessel, said cryogen pressure vessel comprising:

an inner former having a plurality of superconducting magnet coils wound thereon, said inner former including a first pair of end walls extending therefrom, an outer former having a plurality of bucking coils wound thereon, said outer former extending between said first pair of end walls and including a second pair of end walls extending therefrom, an outer shell extending between said second pair of end walls, and wherein said inner former, said outer former, said first pair of end walls, said second pair of end walls, and said outer shell form a fluid boundary to retain a cryogen within said cryogen pressure vessel.

22. The cryogen pressure vessel assembly of claim 21, said cryogen pressure vessel assembly further comprising:

a pressure face formed on said inner former, said pressure face contacting said superconducting magnet coil;

a radial slot disposed in said pressure face, said radial slot for receiving wires entering and exiting a superconducting magnet coil; and a plurality of wire clamps positioned in said radial slot, each wire clamp in said plurality of wire clamps including:

a front face extending coplanar with said pressure face.

a rear face opposite said front face, said rear face contacting a back surface of said radial slot, and a recess formed in said rear face, said recess forming a channel for passage of said wires entering and exiting said superconducting magnet coil.

23. The cryogen pressure vessel assembly of claim 22, wherein each wire clamp in said plurality of wire clamps further includes:

first and second arcuate slots in communication with said recess, said first and second arcuate slots being sized to accept a single wire forming a portion of said superconducting magnet coil.

24. A magnetic resonance imaging system comprising:

a superconducting magnet assembly including:

an outer vacuum vessel defining an inner bore, a cryogen pressure vessel disposed within said outer vacuum vessel, said cryogen pressure vessel comprising:

an inner former having a plurality of superconducting magnet coils wound thereon, said inner former including a first pair of end walls extending therefrom, an outer former having a plurality of bucking coils wound thereon, said outer former extending between said first pair of end walls and including a second pair of end walls extending therefrom, an outer shell extending between said second pair of end walls, and wherein said inner former, said outer former, said first pair of end walls, said second pair of end walls, and said outer shell form a fluid boundary to retain a cryogen within said cryogen pressure vessel; and a gradient magnetic field coil assembly disposed in said inner bore.

25. The magnetic resonance imaging system of claim 24, wherein said cryogen pressure vessel assembly further includes:

a pressure face formed on said inner former, said pressure face contacting said superconducting magnet coil;

a radial slot disposed in said pressure face, said radial slot for receiving wires entering and exiting a superconducting magnet coil; and a plurality of wire clamps positioned in said radial slot, each wire clamp in said plurality of wire clamps including:

a front face extending coplanar with said pressure face, a rear face opposite said front face, said rear face contacting a back surface of said radial slot, and a recess formed in said rear face, said recess forming a channel for passage of said wires entering and exiting said superconducting magnet coil.

26. The magnetic resonance imaging system of claim 25, wherein each wire clamp in said plurality of wire clamps further includes:

first and second arcuate slots in communication with said recess, said first and second arcuate slots being sized to accept a single wire forming a portion of said superconducting magnet coil.

27. A magnetic resonance imaging system comprising:

a superconducting magnet assembly including:

an outer vacuum vessel defining an inner bore, a cryogen pressure vessel disposed within said outer vacuum vessel, said cryogen pressure vessel comprising:

a coil former, a coil disposed on said coil former, a pressure face formed on said coil former, said pressure face contacting said coil, a radial slot disposed in said pressure face, said radial slot for receiving wires entering and exiting said coil, and a plurality of wire clamps positioned in said radial slot, each wire clamp in said plurality of wire clamps including:

a front face extending coplanar with said pressure face, a rear face opposite said front face, said rear face contacting a back surface of said radial slot, and a recess formed in said rear face, said recess forming a channel for passage of said wires entering and exiting said coil; and a gradient magnetic field coil assembly disposed in said inner bore.

28. The magnetic resonance imaging system of claim 27, wherein each wire clamp in said plurality of wire clamps further includes:

first and second arcuate slots in communication with said recess, said first and second arcuate slots being sized to accept a single wire forming a portion of said coil.

29. The magnetic resonance imaging system of claim 28, wherein each wire clamp in said plurality of wire clamps further includes:

a chamfer extending between said recess and said first and second arcuate slots.

30. The magnetic resonance imaging system of claim 29, further comprising:

alignment pins extending along said radial slot, said plurality of wire clamps being disposed on said alignment pins.

* * * * *